United States Patent
Bhakta et al.

(10) Patent No.: US 6,222,739 B1
(45) Date of Patent: Apr. 24, 2001

(54) HIGH-DENSITY COMPUTER MODULE WITH STACKED PARALLEL-PLANE PACKAGING

(75) Inventors: Jayesh R. Bhakta, Cerritos; Kavous Vakilian, Laguna Hills, both of CA (US)

(73) Assignee: Viking Components, Rancho Santa Margarita, CA (US)

( * ) Notice: Subject to any disclaimer, the term of this patent is extended or adjusted under 35 U.S.C. 154(b) by 0 days.

(21) Appl. No.: 09/228,867

(22) Filed: Jan. 12, 1999

Related U.S. Application Data

(63) Continuation-in-part of application No. 09/008,925, filed on Jan. 20, 1998, now abandoned.

(51) Int. Cl.[7] .............................. H05K 1/11; H05K 1/14; H01R 12/04
(52) U.S. Cl. ......................... 361/790; 361/785; 361/791; 361/803; 257/686; 257/723; 439/69; 439/74
(58) Field of Search .................... 361/790, 791, 361/803, 785; 257/686, 723; 439/69, 74

(56) References Cited

U.S. PATENT DOCUMENTS

| | | | |
|---|---|---|---|
| 4,683,550 | * 7/1987 | Jindrick et al. | 439/74 |
| 4,982,265 | 1/1991 | Watanabe et al. | 257/737 |
| 5,191,404 | 3/1993 | Wu et al. | 257/723 |
| 5,394,300 | 2/1995 | Yoshimura | 361/737 |
| 5,463,249 | * 10/1995 | Shinbo et al. | 257/723 |
| 5,491,612 | 2/1996 | Nicewarner, Jr. | 361/790 |
| 5,495,397 | 2/1996 | Davidson et al. | 361/783 |
| 5,548,486 | 8/1996 | Kman et al. | 361/791 |
| 5,583,749 | 12/1996 | Tredennick et al. | 361/790 |
| 5,616,962 | * 4/1997 | Ishikawa et al. | 257/686 |
| 5,636,997 | 6/1997 | Kuroda et al. | 439/74 |
| 5,754,408 | 5/1998 | Derouiche | 361/773 |
| 5,754,409 | * 5/1998 | Smith | 361/803 |
| 5,842,874 | * 12/1998 | Yagi et al. | 439/74 |
| 5,949,657 | * 9/1999 | Karabatsos | 361/803 |
| 6,038,132 | * 3/2000 | Tokunaga et al. | 361/803 |

FOREIGN PATENT DOCUMENTS

| | | |
|---|---|---|
| 2 237 691 | 8/1991 | (GB) . |
| 2-235389 | 9/1990 | (JP) . |
| 4-206765 | 7/1992 | (JP) . |
| 4-312992 | 11/1992 | (JP) . |
| 4-335561 | 11/1992 | (JP) . |

* cited by examiner

Primary Examiner—Jeffrey Gaffin
Assistant Examiner—John B. Vigushin
(74) Attorney, Agent, or Firm—Oppenheimer Wolff & Donnelly LLP

(57) ABSTRACT

A module for insertion into an expansion slot of a computer includes a primary board and a pair of auxiliary boards. The auxiliary boards are mounted in a spaced relationship on respective sides of the primary board to define air paths between the boards. The air paths allow air to circulate between the boards. The auxiliary boards each have a trace for electrically connecting the board to the primary board, and the primary board has a trace for connecting chips mounted thereon to an interface with the expansion slot. The traces of the auxiliary boards are substantially the same length. The trace of the primary boards is only slightly longer than the traces of the auxiliary boards.

43 Claims, 13 Drawing Sheets

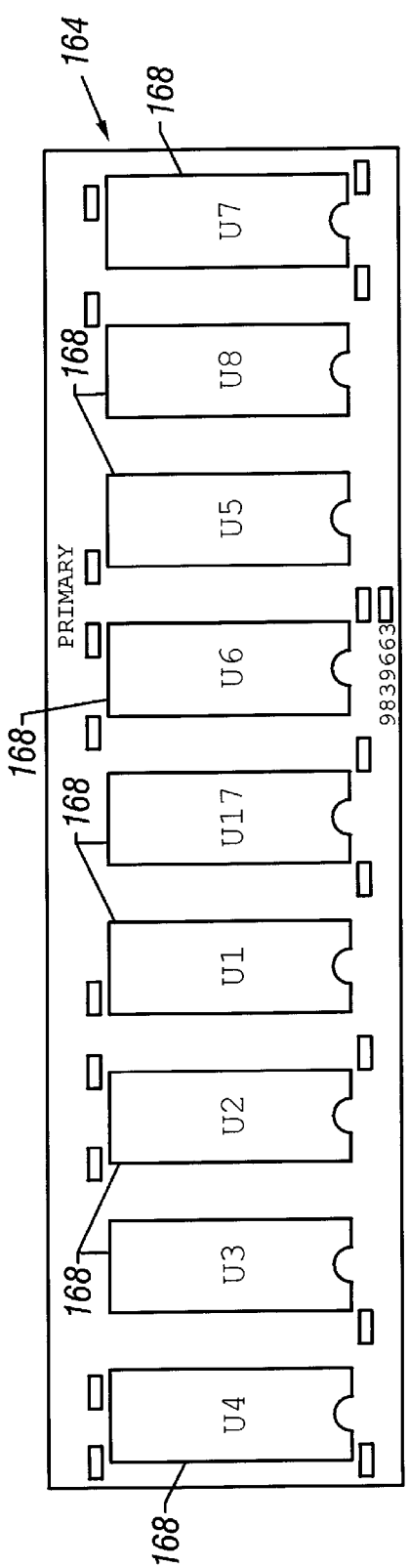
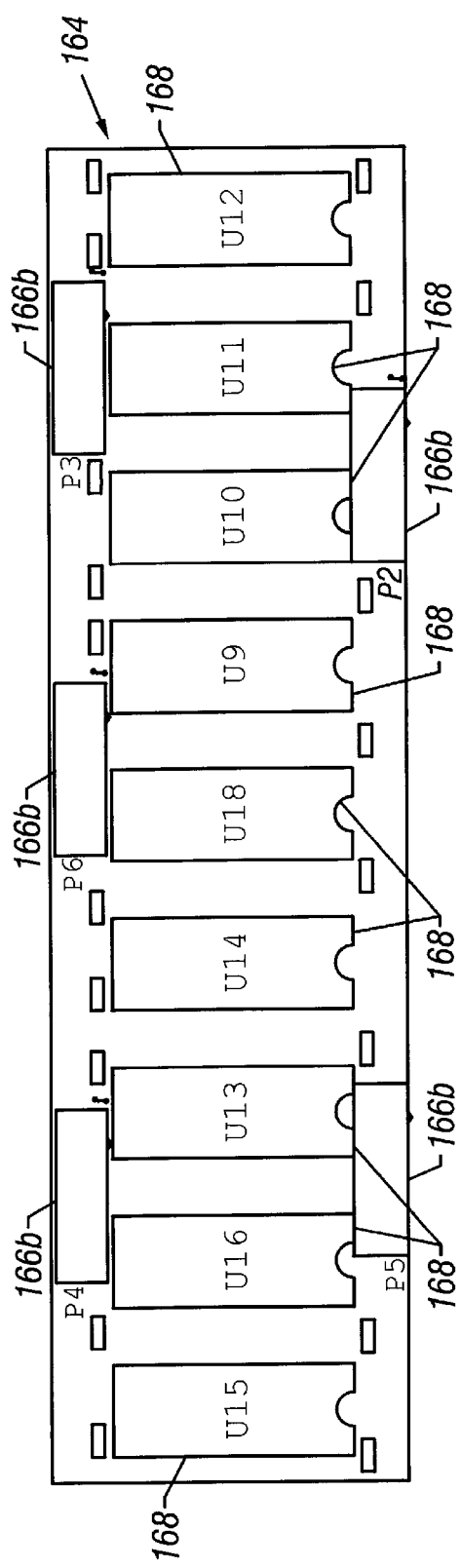
FIG. 10A
FIG. 10B

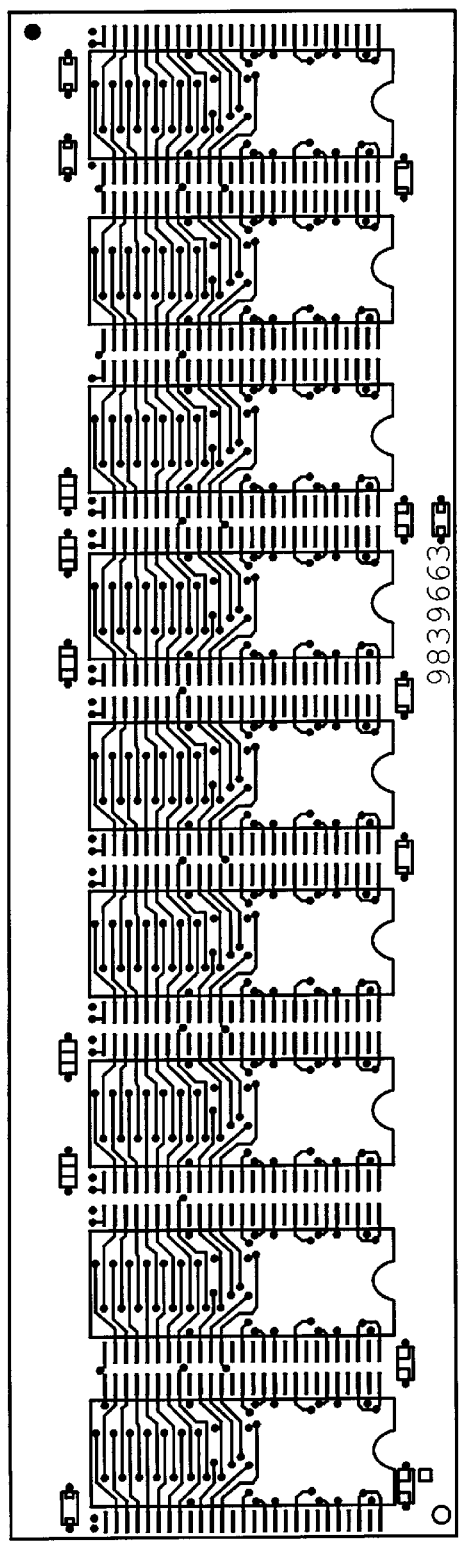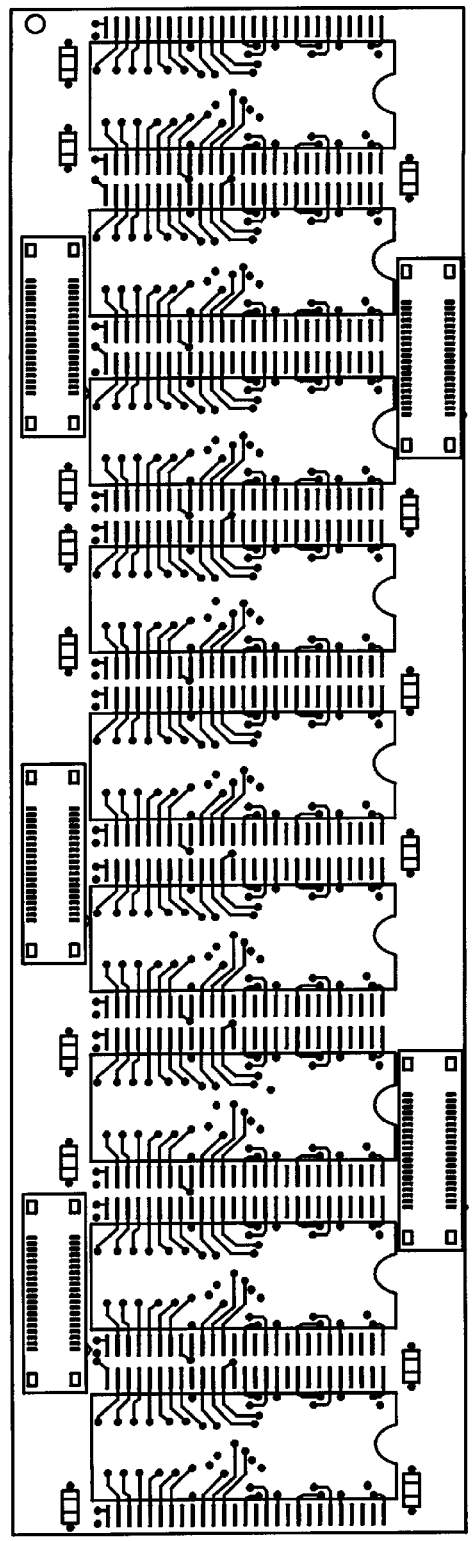
FIG. 12A
FIG. 12B

HIGH-DENSITY COMPUTER MODULE WITH STACKED PARALLEL-PLANE PACKAGING

CROSS-REFERENCE TO RELATED APPLICATION

This is a continuation-in-part of application Ser. No. 09/008,925, filed Jan. 20, 1998 now abandoned. The entire content of this application is hereby incorporated by reference.

FIELD OF THE INVENTION

The present invention is directed to computer memory boards and, more particularly, to expansion modules for mounting in an expansion slot of a mother board of a computer.

BACKGROUND OF THE INVENTION

It is well known that in the electronics industry, particularly the personal computer industry, that the trend is to design products which are smaller, lighter, and more compact while maintaining or increasing power, speed, and memory capacity. In recent years, the computer industry has experienced the advent of the lap-top computer, the notebook computer, and now the palm-top computer. Although these computers are amazingly compact and lightweight, they are still incredibly powerful and fast. They are capable of running software applications that only in the recent past were able to be run on desk-top computers with large amounts of memory.

Personal computers (including desk-top, lap-top, notebook, and palm-top computers) include a mother board for controlling the operation of the computer. Personal computers are sold with a specified amount of memory, for example, 1.2 gigabytes (GB) of storage memory on a hard drive and 64 megabytes (MB) of random access memory (RAM). Many users upgrade the RAM of their computers. Accordingly, motherboards typically include standardized expansion slots in which a memory card may be inserted. The expansion slots may also receive cards for upgrading a particular function of the computer, such as cards for sounds, video, and graphics.

A dual in-line memory module (DIMM) connector is a standard industry connector for receiving a memory module. And in accordance with the "smaller-is-better" trend in the computer industry, many mother boards are equipped with only two DIMM connectors. As such, in order to install a larger amount of memory in only two DIMM connectors, higher density memory modules have been developed.

One conventional technique for increasing the storage capacity of a memory module is to double the height of the module. To do so, two rows of memory chips are mounted on the memory module, essentially doubling the capacity of the module. However, there are two primary disadvantages of such a configuration. One disadvantage is the double height. The housing of the computer and the area around the mother board both need to be sufficiently large in order to accommodate this doubled size of the expansion, which runs contrary to the small-is-better design principle. Another disadvantage lies in different trace lengths. A trace is the electrical conductor which connects the chips to the edge connector or interface portion of the module. In the double-row configuration, one row of chips has one trace length, and the other row of chips has another trace length. The trace of the further row of chips is essentially twice as long as the closer row of chips from the edge connector. Accordingly, a signal traveling to the further rows of chips take about twice as long to arrive as the signal traveling to the closer row of chips. This arrangement requires the signal delay to be eliminated, which may be done by synchronizing the signals, which is difficult and expensive to accomplish. Alternatively, the trace of the closer row of chips may be physically doubled in length so that the signals arrive at the two rows at about the same time. Either solution results in a module which is limited in speed by the double-length trace.

Another conventional technique for increasing storage capacity of a memory module is to configure the double-height arrangement discussed above with a foldable portion such as an integral flex conductor. The module may then be folded in half, thereby reducing the height essentially by two. However, this foldable configuration still suffers from the drawback of the varying trace lengths. An additional drawback is created by the folded arrangement in that vertical air circulation is restricted. The components of the module produce heat, and under normal convection the heated air would rise and be drawn out of the computer by a fan. However, the folded portion of the module retains heat between the folded sections, which may cause the module to function improperly and errant.

Accordingly, in view of the foregoing, it is an object of the present invention to provide an expansion module which overcomes the disadvantages and drawbacks associated with conventional expansion modules.

It is another object of the present invention to provide a memory module which maximizes memory per unit volume of space which the memory module occupies.

It is yet another object of the invention to provide a high-density memory module which operates at the highest speed possible.

It is yet another object of the invention to provide a multiple-layer memory module with a minimized trace length.

It is yet another object of the present invention to provide a multiple-layer memory module with substantially equal trace lengths between layers.

It is a further object of the present invention to provide a multiple-layer memory module having boards that can be readily connected and disconnected from each other.

SUMMARY OF THE INVENTION

These and other objects are achieved by the apparatus of the present invention which provides a module for insertion into an expansion slot on a motherboard of a computer. Exemplary module maximizes the speed at which the module operates, maximizes chip density per expansion slot, and minimizes trace length. Although capable of performing all types of functions typical of expansion modules, the module of the present invention is particularly suitable for expanding the memory of a computer, either a desk-top, lap-top, notebook, or palm-top computer.

According to one aspect of the invention, an exemplary module includes a primary board with an interface portion for engaging with the expansion slot. The interface portion may be configured to engage with a conventional 168-pin dual in-line memory module (DIMM) connector, for example. At least one but preferably two auxiliary boards are mounted to respective sides of the primary board. The auxiliary boards are mounted with fasteners in a spaced relationship which defines an air path between each of the auxiliary boards and the primary board. Each of the auxiliary boards has a trace for electrically connecting the board to the primary board.

One of the advantages of the invention is that the air spaces allow air to circulate between the boards. Each of the boards may have a plurality of chips mounted thereon which generate heat when operating. In addition, the computer in which the module is inserted is a closed environment with many electronic components which also generate heat. As temperature increases, the speed of a chip decreases because of increased resistance. However, in accordance with the present invention, air is able to freely circulate between the boards, thereby either cooling the chips or at least providing adequate ventilation to prevent the ambient temperature from increasing undesirably.

Another aspect of the present invention focuses on the traces. In addition to the traces of the auxiliary board or boards, the primary board has a trace connecting the interface portion with any number of the chips that may be mounted thereon. The traces of the auxiliary boards have substantially the same length, which is only slightly longer than that of the trace of the primary board.

In contrast to conventional double-height arrangement in which one of the traces is essentially twice as long as the other trace, the traces of the module of the present invention are substantially the same length. This feature of equal trace length advantageously eliminates the need for synchronizing signals to different rows of chips. In addition, by way of example only, the module of the invention reduces trace length on average by about 20% to 50% over conventional arrangements or some other value consistent with operational parameters. The reduction in trace length results in a much faster operating module.

Another aspect of the present invention focuses on surface mount connectors, which are a specific type of fastener, that enable the auxiliary boards to be securely mounted to respective sides of the primary boards. One of the advantages of the surface mount connectors is the ease in which the auxiliary boards can be mounted and dismounted from the primary board, thus, reducing the time and costs of assembly. In addition, electrical failure verification and failure analysis can be readily performed by easily separating the auxiliary boards from the primary board and interfacing the individual boards with test equipment via the surface mount connectors.

Other aspects, features, and advantages of the present invention will become apparent to those persons having ordinary skill in the art to which the present invention pertains from the following description taken in conjunction with the accompanying drawings.

BRIEF DESCRIPTION OF THE DRAWINGS

FIG. 10A is a side view of an auxiliary board of the expansion module illustrated in FIG. 7, illustrating a plurality of chips mounted on a first side of the auxiliary board;

FIG. 10B is a view similar to that of FIG. 10A, illustrating a plurality of chips and surface mount connectors mounted on a second side of the auxiliary board;

FIG. 12A is a side view of the auxiliary board of the expansion module shown in FIG. 7, particularly highlighting a masked wiring arrangement of the first side of the auxiliary board;

FIG. 12B is a view similar to that of FIG. 12A, illustrating a masked wiring arrangement on the second side of the auxiliary board;

DETAILED DESCRIPTION OF EXEMPLARY EMBODIMENTS

Figure 1:
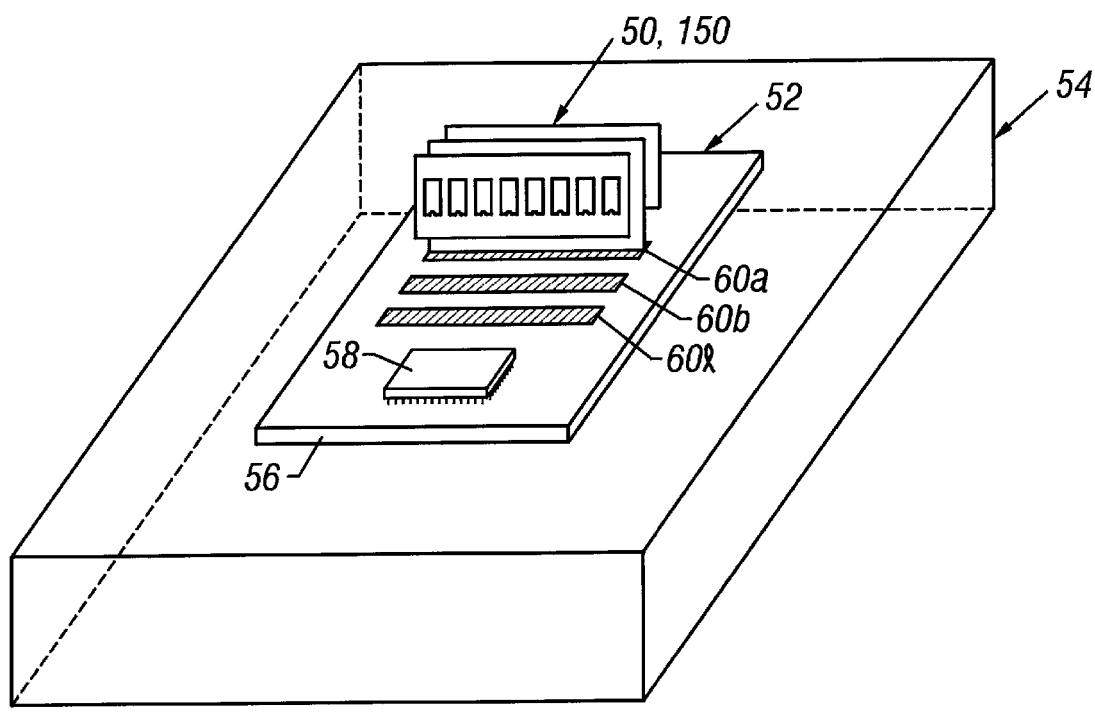
FIG. 1 is a perspective view of an exemplary embodiment of an expansion module of the present invention, particularly illustrating the expansion module mounted in an expansion slot of a mother board of a computer.

Referring to the drawings in more detail, in FIG. 1 an exemplary embodiment of a high-density, stacked parallel-plane module 50 and 150 of the present invention is illustrated. Exemplary module 50 and 150 is installable in a mother board 52 of a computer 54. As known in the art, mother board 52 includes a main board 56 with a microprocessor 58 mounted thereon. Mother board 52 may include a plurality of additional semiconductor chips and electronic components operatively associated with microprocessor 58, which additional chips and components are not shown in the drawings for clarity. Also not shown in the drawings are components and peripheral devices which may be configured with computer 52, including a monitor, input devices such as a keyboard and/or a mouse, network connections, output devices such as a printer, and so on.

Mother board 52 also includes at least one, but in general a plurality of expansion slots 60a–1 in communication with microprocessor 58. Expansion slots 60a–1 may respectively receive add-on modules for performing particular functions. For example, a memory module may be inserted into one of the expansion slots 60 to increase the amount of memory of computer 54. The expansion slots 60 are also known in the art as connectors. A 168-pin dual in-line memory module (DIMM) connector is an example of a standard expansion slot or connector commonly used in industry today. As computers become increasingly small and compact, particularly portable computers such as lap-top computers and now palm-top computers, many mother boards for desk-top computers are equipped with as few as two 168-pin DIMM connectors. As a referencing convention for this description, expansion slots (or connectors) are referenced generally by numeral 60, with each particular expansion slot referenced specifically by alpha suffix a, b, . . . l, respectively. This referencing convention will be utilized throughout this description for the expansion slots as well as for other plural elements of the present invention.

Figure 2:
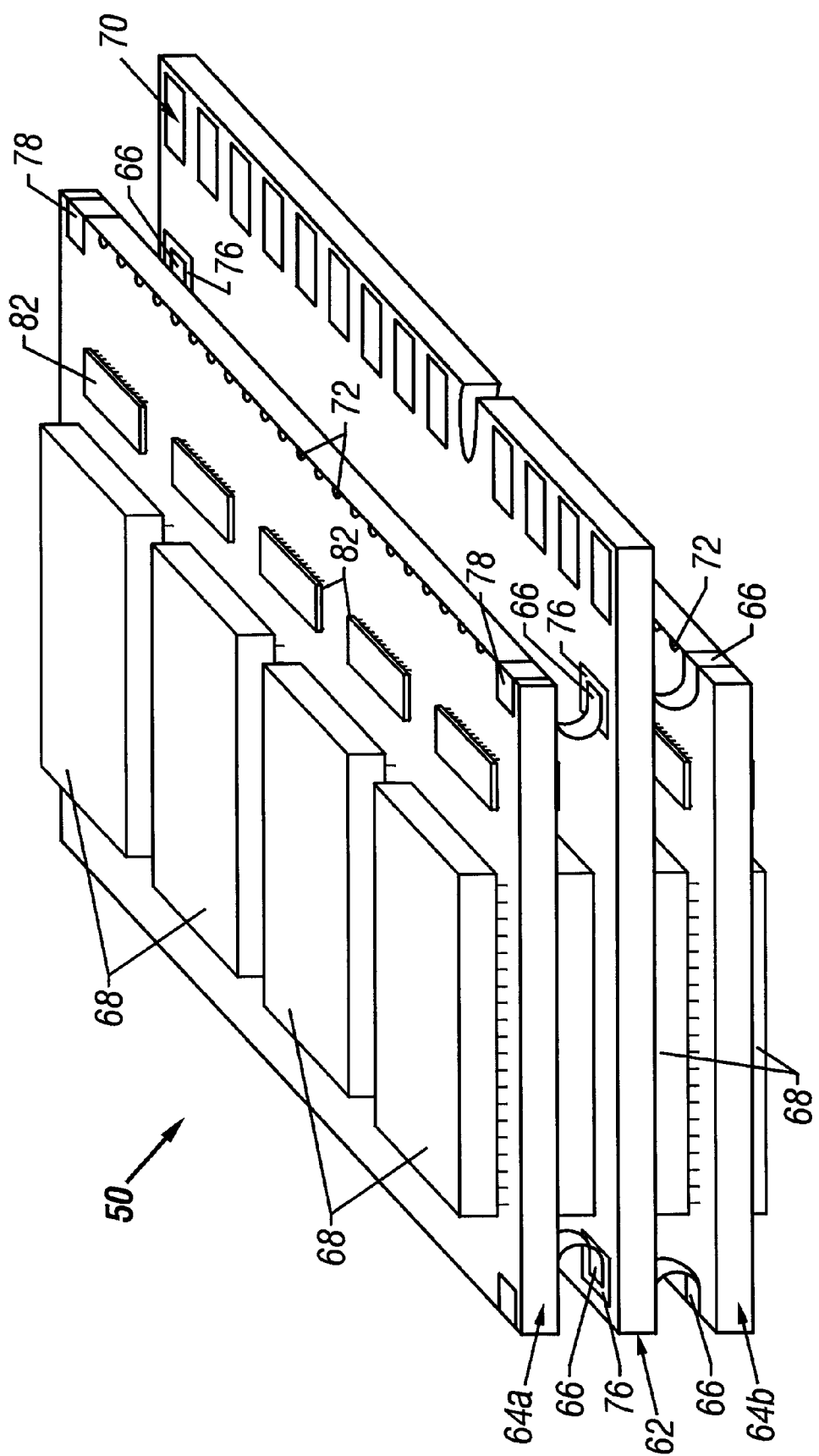
FIG. 2 is a perspective view of an exemplary expansion module of the present invention, illustrating a multiple-layer, parallel-plane configuration of boards.

Referencing FIG. 2, exemplary module 50 of the present invention includes a primary board 62 and at least one auxiliary board 64. As exemplified in the embodiment shown in FIG. 2, exemplary module 50 includes a pair of auxiliary boards 64a and 64b. Upon reading this description, those skilled in the art will appreciate that module 50 of the invention may include a plurality of auxiliary boards 64a–m. Auxiliary boards 64 are mounted to primary board 62 with fasteners 66. As illustrated, auxiliary boards 64a and 64b are configured in a substantially spaced and parallel-plane relationship with respect to primary board 62, with one of the auxiliary boards 64 being mounted on a first side of primary board 62 and the other auxiliary board 64 being mounted on a second side of primary board 62. Such as relationship has a number of advantages, including ventilation, high density, reduced trace length, ease of manufacturing, which advantages will be discussed in more detail below. Exemplary boards 62 and 64 may be generally configured as printed circuit boards (PCBs) or printed wiring boards (PWBs), as known in the art. In addition to mechanically mounting auxiliary boards 64 to primary board 62, a number of fasteners 66 or each may also be conductive and serve as electrical connections, which will also be discussed in more detail below.

Figure 3A:
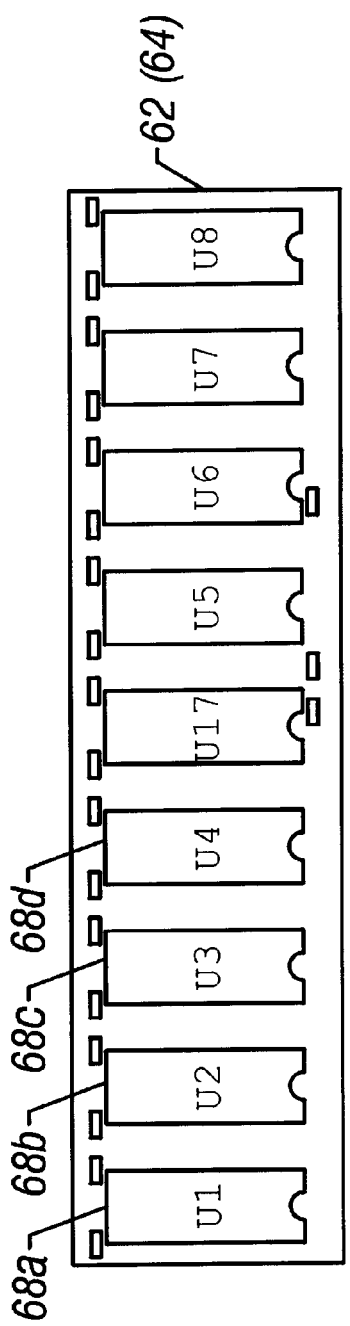
FIG. 3A is a side view of an auxiliary board of an expansion module of the invention, illustrating a plurality of chips mounted on a first side of the board.
Figure 3B:
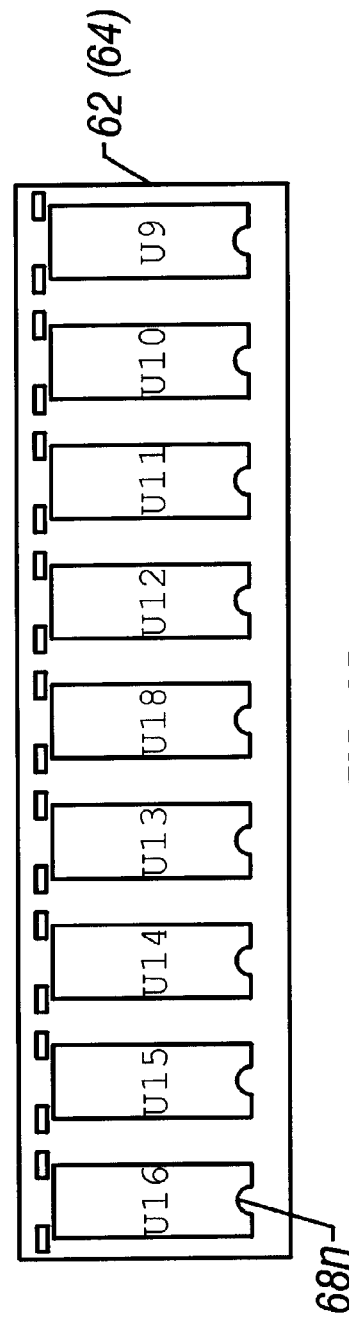
FIG. 3B is a view similar to that of FIG. 3A, illustrating a plurality of chips mounted on a second side of the board.
Figure 4:
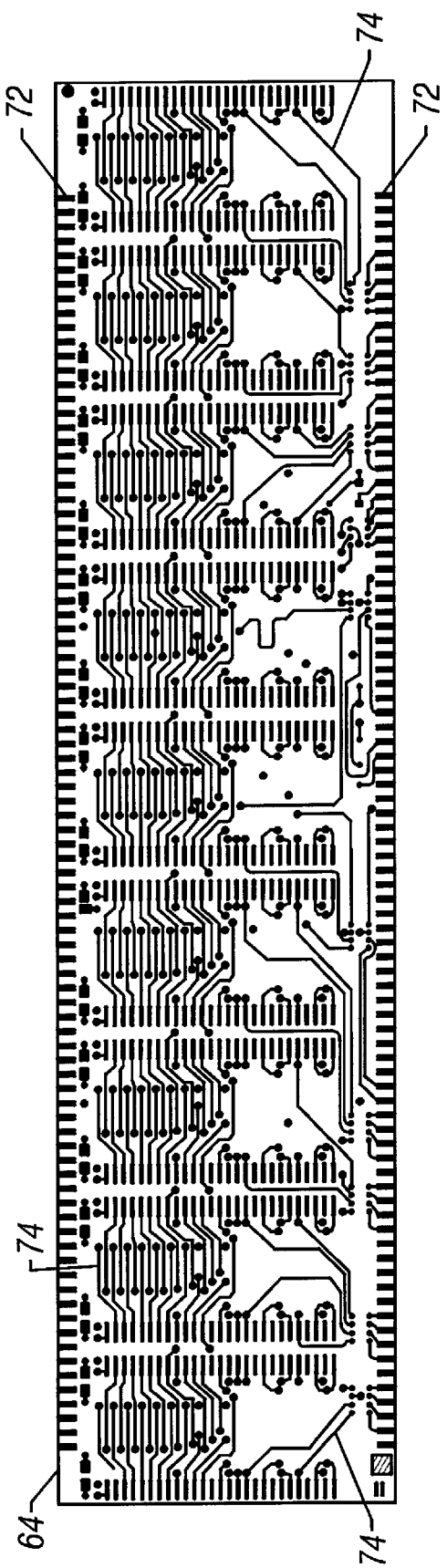
FIG. 4 is a side view of a board of an exemplary expansion module of the invention, particularly highlighting a masked wiring arrangement of the board.

With additional reference to FIGS. 3A and 3B, each board 62 and 64 may include a plurality of chips 68a–n mounted on each side thereof. Each chip 68 may perform a particular function. For example, each chip 68 may be a memory chip so that exemplary module 50 is a high-density memory module. Exemplary primary board 62 includes an electrical interface portion 70 for connecting with one of the expansion slots 60. With additional reference to FIG. 4, each auxiliary board 64 includes edge pins 72 arranged generally around a periphery thereof. Chips 68 mounted on boards 62 and/or 64 communicate with pins 72 with traces 74. Boards 62 and 64 may be configured with chips 68, interface portion 70, and pins 72 as known in the art of fabricating printed circuit boards. For example, each board 62 and 64 may be a multiple-layer glass epoxy configuration with interface 70 and edge pins 72 being formed by applying gold over nickel. Traces 74 may be applied by solder masks. Electrical connections between auxiliary boards 64 and primary board 62 may be made by fasteners 66 respectively mounted on pads 76 of primary board 62 and pads 78 of auxiliary boards 64. Pads 76 of primary board 62 are electrically connected to interface portion 70 (which includes a plurality of standard edge connectors as known in the art). Pads 78 of auxiliary boards 62 are electrically connected to edge pins 72.

With further reference to FIG. 1, the art of chip fabrication allows microprocessor 58 to operate at increasing high speeds. For example, microprocessor 58 may operate on the order of hundreds of megahertz (MHz). Accordingly, if expansion module 50 is configured as a memory module, such as a synchronous dynamic random access memory (SDRAM), memory module 50 needs to operate at about 100 MHz or more. Switching times at 100 MHz are on the order of 10 nanoseconds (ns).

Electrical signals travel on traces 74 from pins 72 to chips 68. A time (t) required for an electrical signal to travel from interface portion 70 to a chip may be determined by dividing a length (l) of a trace from interface portion 70 to the chip by a velocity (v) at which electrical signal travels, or t=l/v. As velocity v is substantially constant for the electrical signal (which is nearly equal to the speed of light), time t is substantially proportional to length l, with the length being the variable in the equation. In order to maximize the speed at which module 50 operates, the time the electrical signals reach chips 68 needs to be minimized. To minimize the time, trace length l needs to be minimized. The velocity of the electrical signal will vary according to temperature, in that as temperature increases, velocity decreases, which will be discuss below.

Figure 5:
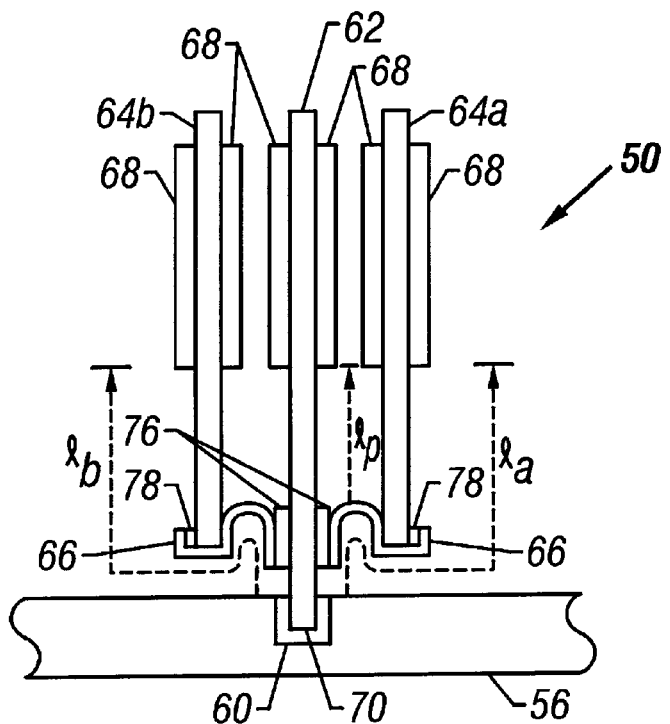
FIG. 5 is a cross-sectional view of an expansion module of the invention, particularly illustrating minimized trace lengths of auxiliary boards and a primary board of the module.

With additional reference to FIG. 5, trace length l may be defined as the total length of the electrical connection extending from the edge connectors of interface portion 70 of primary board 62 to one of the chips 68. In accordance with this definition, auxiliary board 64a has a trace length $l_a$, and auxiliary board 64b has a trace length $l_b$, as shown by the dashed arrows. Exemplary module 50 is configured such that trace lengths $l_a$ and $l_b$ of auxiliary boards 64a and 64b are substantially equal. In addition, auxiliary trace lengths $l_a$ and $l_b$ are only slightly longer than a trace length $l_p$ of primary board 62, with the additional length being added by conductive fasteners 66. In accordance with an exemplary embodiment of module 50, primary trace length $l_p$ may be increased by a small predetermined amount to be substantially equal to auxiliary trace lengths $l_a$ and $l_b$. By way of example only, the trace lengths of the exemplary module 50 may be 20% less to up to 50% less than those of conventional modules, or some other value consistent with operational parameters.

It is preferred for fasteners 66 positioned along bottom edges of boards 62 and 64 (that is, near mother board 56) to serve as electrical connectors for carrying the most significant or time-dependent electrical signals from mother board 56 to auxiliary boards 64 of module 50. Fasteners 66 positioned along top edges of boards 62 and 64 (that is, along edges opposite to that at which interface portion 70 is disposed as shown in FIG. 2) may serve as electrical connectors for carrying less time-dependent signals, such as power, ground, and address lines, for example.

Figure 6:
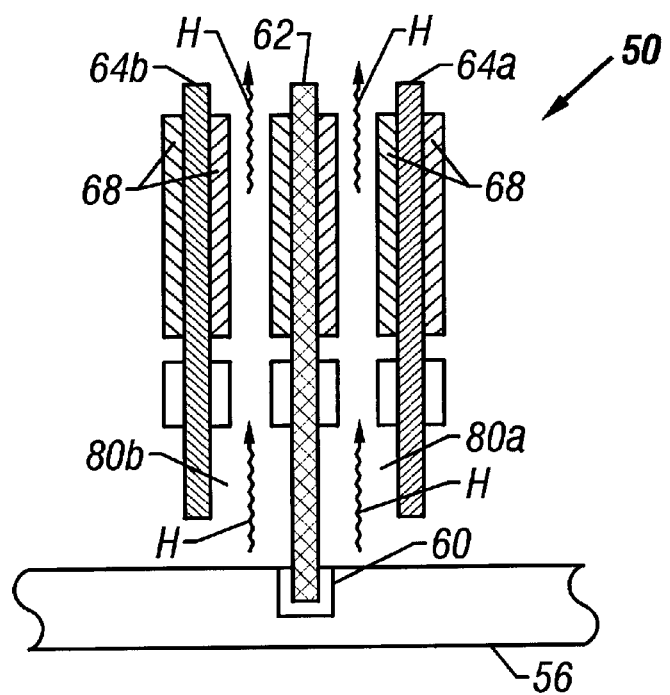
FIG. 6 is a cross-sectional view of an exemplary module of the invention, particularly illustrating open air paths defined between boards in a spaced relationship.

As mentioned above, the velocity v at which an electrical signals travel along a trace 74 from a pin 72 to a chip 68, and vice versa, is inversely proportional to temperature (T), that is, v (1/T). Accordingly, if temperature T increases, then velocity v decreases and module 50 operates at a slower speed. To maximize the speed, temperature needs to be minimized, or at least maintained within a predetermined operating range or specification. With additional reference to FIG. 6, module 50 is illustrated mounted in an expansion slot 60 of a mother board 56. (Fasteners 66 are not illustrated for clarity.) In operation, chips 68 generate heat. If the generated heat is not ventilated, then the ambient temperature around module 50 will increase, thereby decreasing the speed of the module 50.

According to the present invention, the spaced parallel-plane arrangement of module 50 defines an air path 80a between auxiliary board 64a and primary board 62 and an air path 80b between auxiliary board 64b and primary board 62. Air paths 80 are open along top and bottom edges of boards 62 and 64. As shown in FIG. 1, fasteners 66 are relatively small and do not present substantial air blockage. Air paths 80 promote circulation and allow heat (which is shown by cursive arrows and reference H) to rise and escape. As discussed above, conventional modules have a closed flex conductor section extending along top edges of and between a pair of boards, which prevents air circulation and traps heat between the boards, thereby greatly increasing the ambient temperature at the module and, correspondingly, decreasing the speed. Increased temperature may also cause modules to malfunction and introduce errors.

Referencing FIG. 1 and 2, one of the preferred commercial embodiments of exemplary module 50 is a memory module for augmenting existing memory of computer 54. As such, chips 68 may be synchronous dynamic RAM (SDRAM) chips. Module 50 may also include a plurality of damping resistor packages 82 configured with the SDRAM chips. One of the advantages of the memory module embodiment of the present invention is that the amount of memory per module and memory per unit volume is maximized. For example, exemplary memory module 50 may include more than 256 MB for a standard 168-pin DIMM configuration. As the art of chip fabrication advances, it is obvious to those skilled in the art that more memory will be able to be included on module 50.

Figure 7:
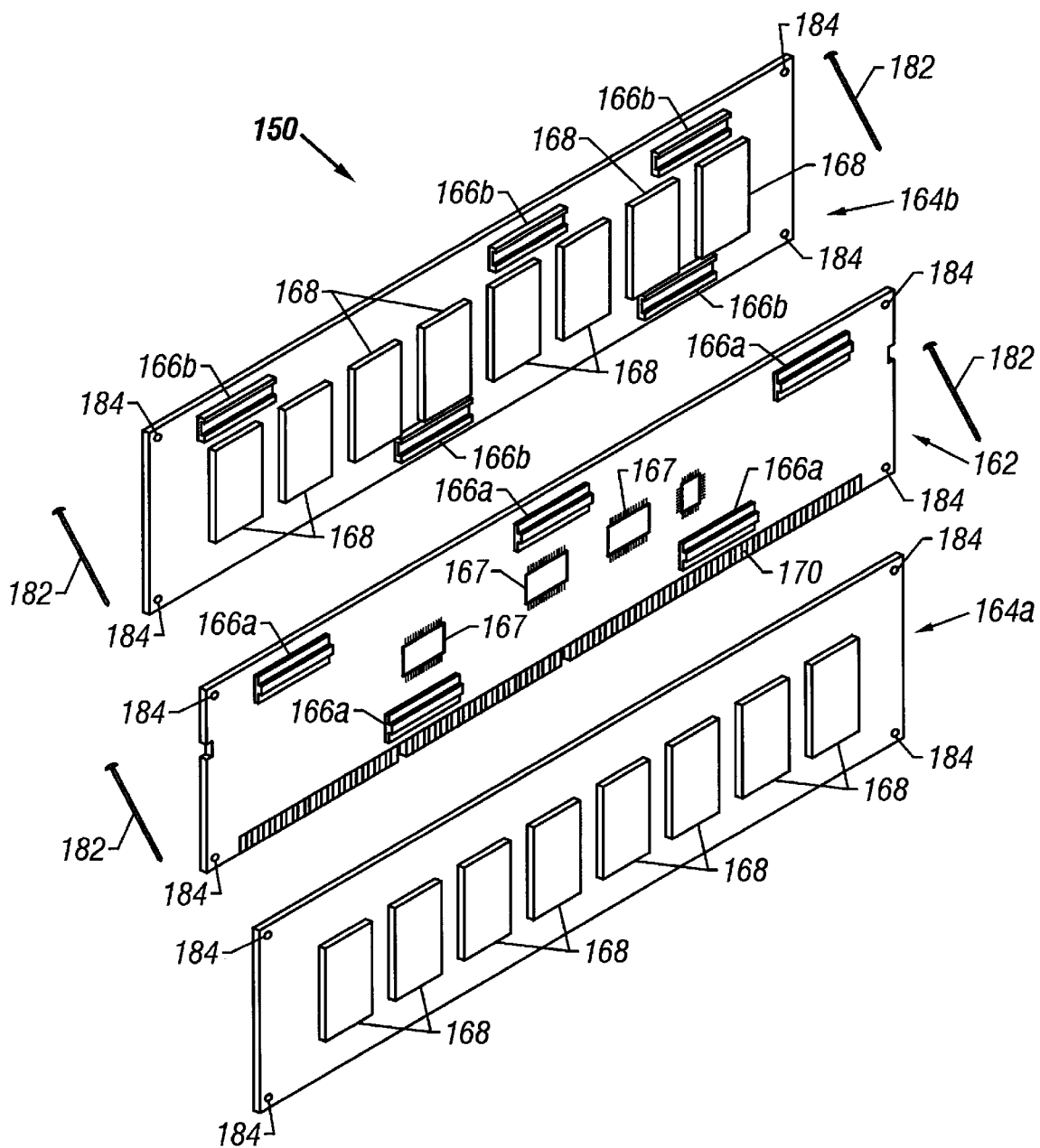
FIG. 7 is an exploded perspective view of an alternative embodiment of an expansion module of the present invention, illustrating a plurality of surface mount connectors.
Figure 8:
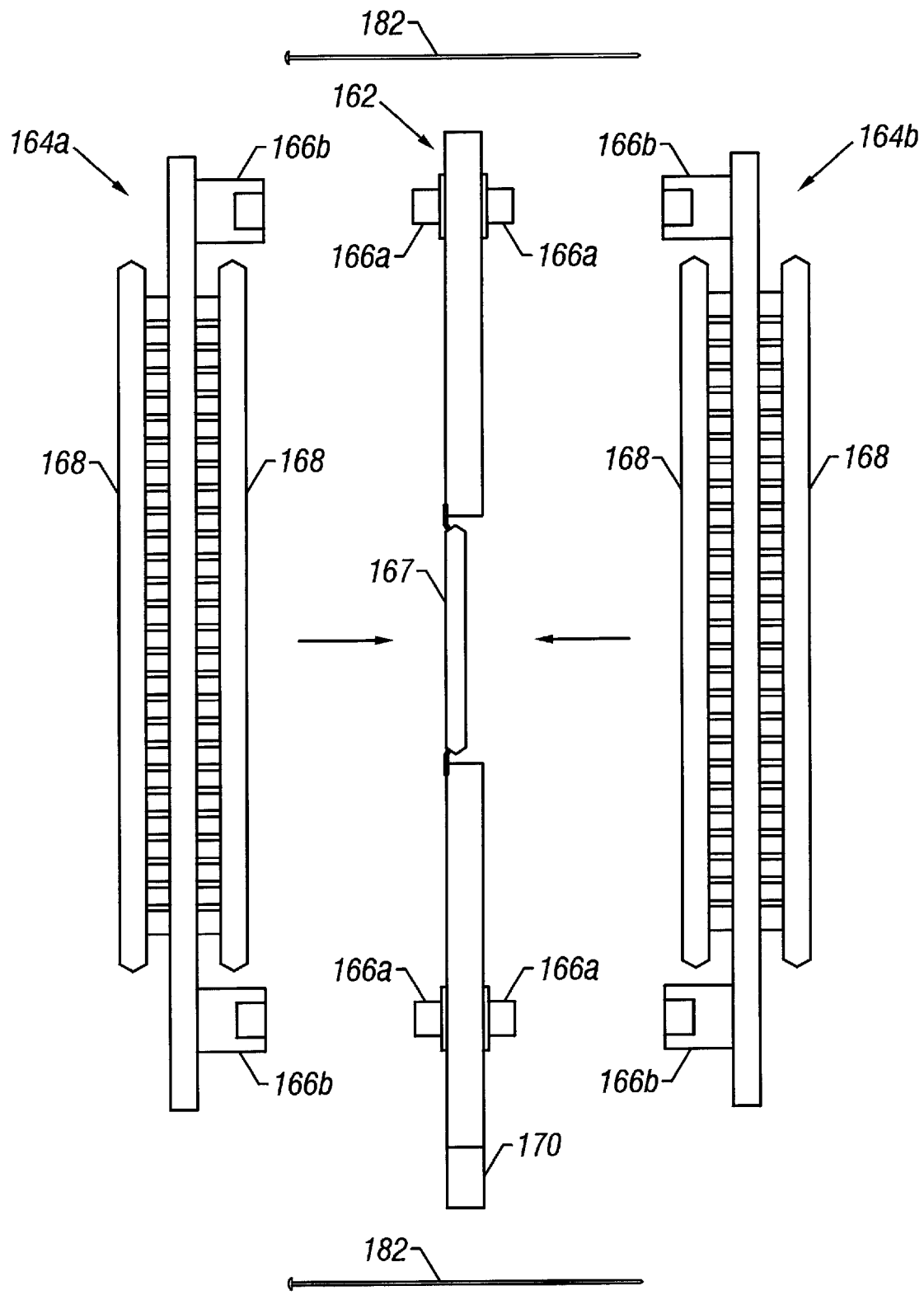
FIG. 8 is an exploded cross-sectional view of the expansion module illustrated in FIG. 7.

Referring now to FIGS. 7 and 8, an alternative embodiment of a high-density, stacked parallel-plane module 150 of the present invention is illustrated. Exemplary module 150 is installable in the mother board 52 of the computer 54 illustrated in FIG. 1. Exemplary module 150 of the present invention includes a primary board 162 and at least one auxiliary board 164. As exemplified in the embodiment shown in FIG. 7, exemplary module 150 includes a pair of auxiliary boards 164a and 164b. Those skilled in the art will appreciate that module 150 of the invention may include a plurality of auxiliary boards 164a–m. Auxiliary boards 164 are mounted to primary board 162 with surface mount connectors 166 such as Fine Stack connectors available from AMP. As illustrated, auxiliary boards 164a and 164b are configured in a substantially spaced and parallel-plane relationship with respect to primary board 162, with one of the auxiliary boards 164 being mounted on a first side of primary board 162 and the other auxiliary board 164 being mounted on a second side of primary board 162. Exemplary boards 162 and 164 may be generally configured as PCBs or PWBs. In addition to mechanically mounting auxiliary boards 164 to primary board 162, the surface mount connectors 166 also serve as electrical connections, which will be discussed in more detail below.

Figure 9A:
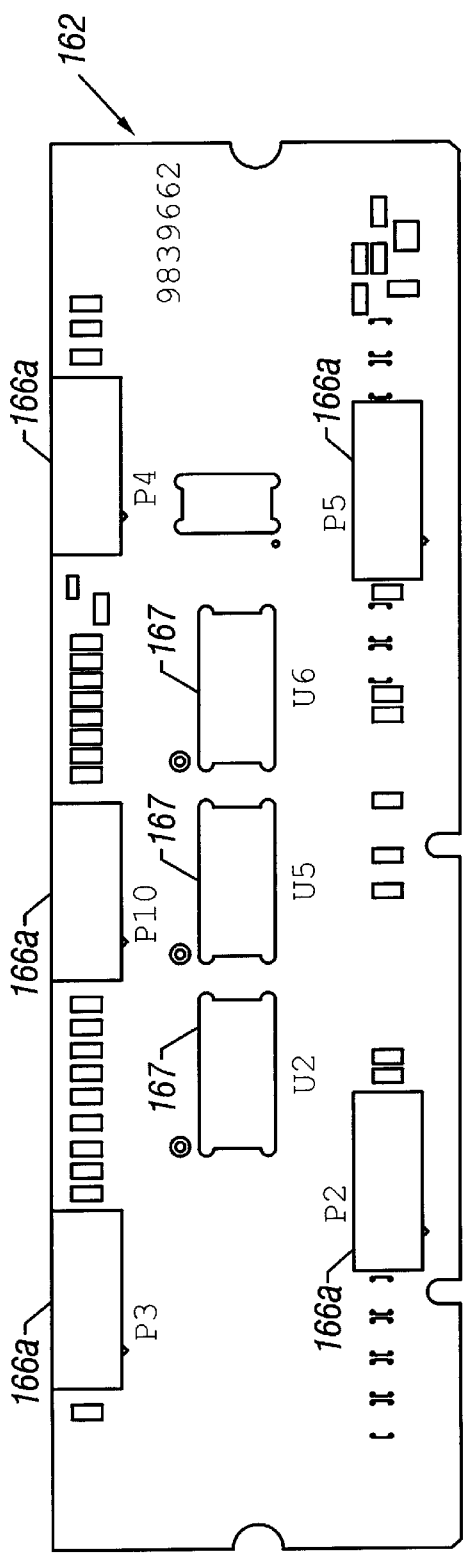
FIG. 9A is a side view of a primary board of the expansion module illustrated in FIG. 7, illustrating a plurality of chips and surface mount connectors mounted on a first side of the primary board.
Figure 9B:
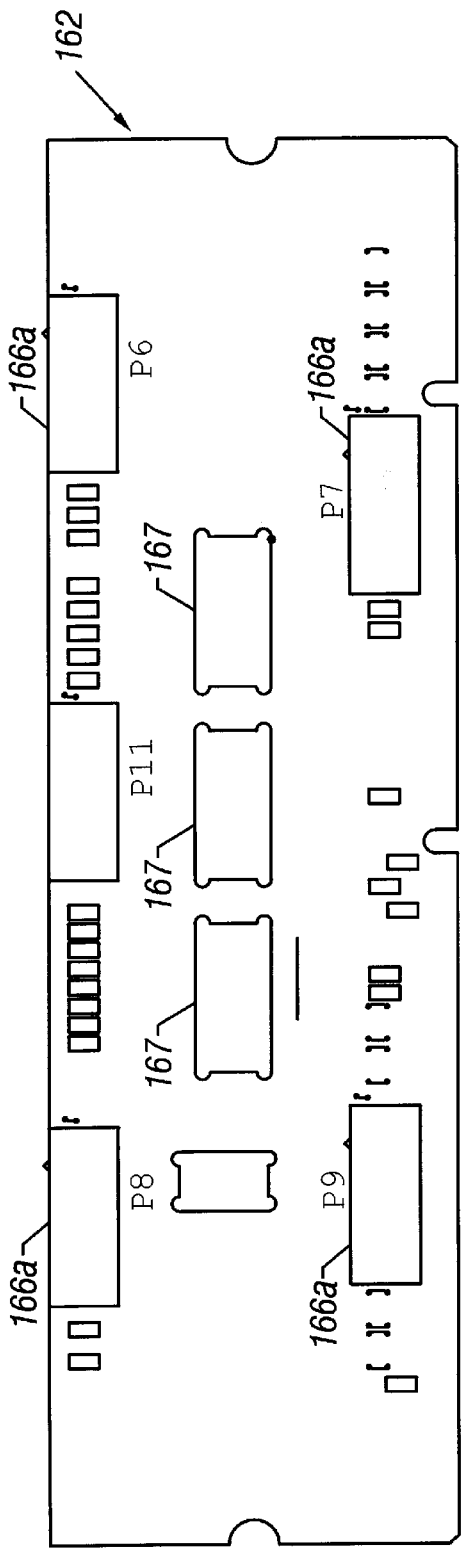
FIG. 9B is a view similar to that of FIG. 9A, illustrating a plurality of chips and surface mount connectors mounted on a second side of the primary board.

With additional reference to FIGS. 9A and 9B, primary board 162 may include a plurality of chips 167a–c mounted within an opening thereof, and with additional reference to FIGS. 10A and 10B, auxiliary boards 164 may include a plurality of chips 168a–n mounted on each side thereof. Each chip 167 and 168 may perform a particular function such as a memory chip so that exemplary module 150 is a high-density memory module. Exemplary primary board 162 includes an electrical interface portion 170 for connecting with one of the expansion slots 60.

Figure 11A:
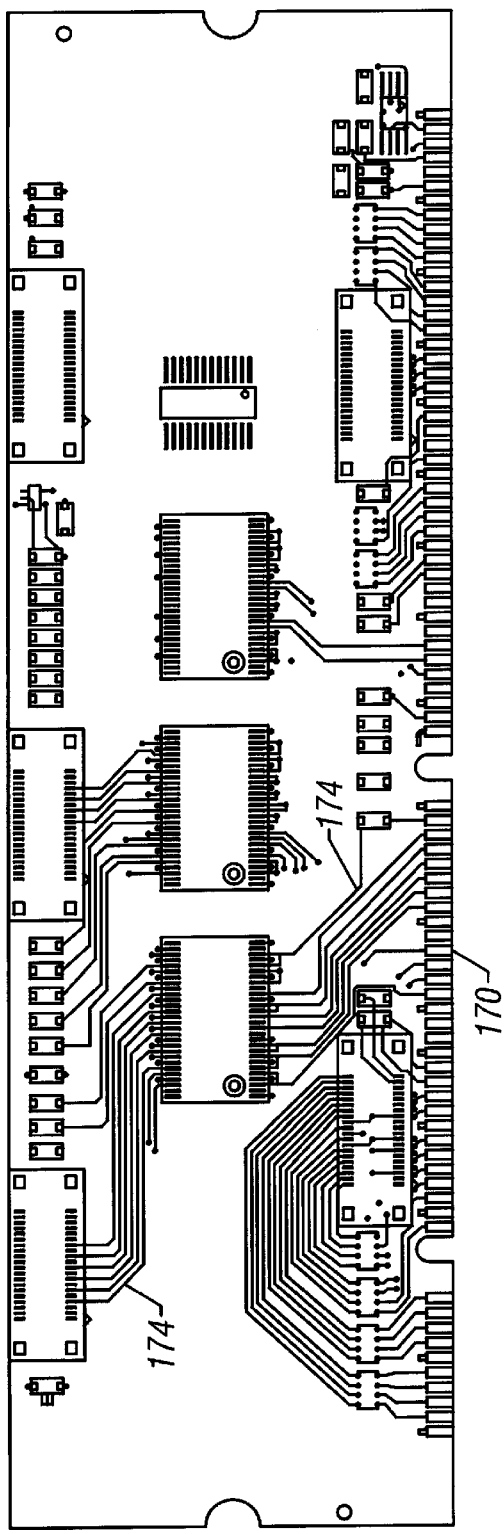
FIG. 11A is a side view of the primary board of the expansion module shown in FIG. 7, particularly highlighting a masked wiring arrangement of the first side of the primary board.
Figure 11B:
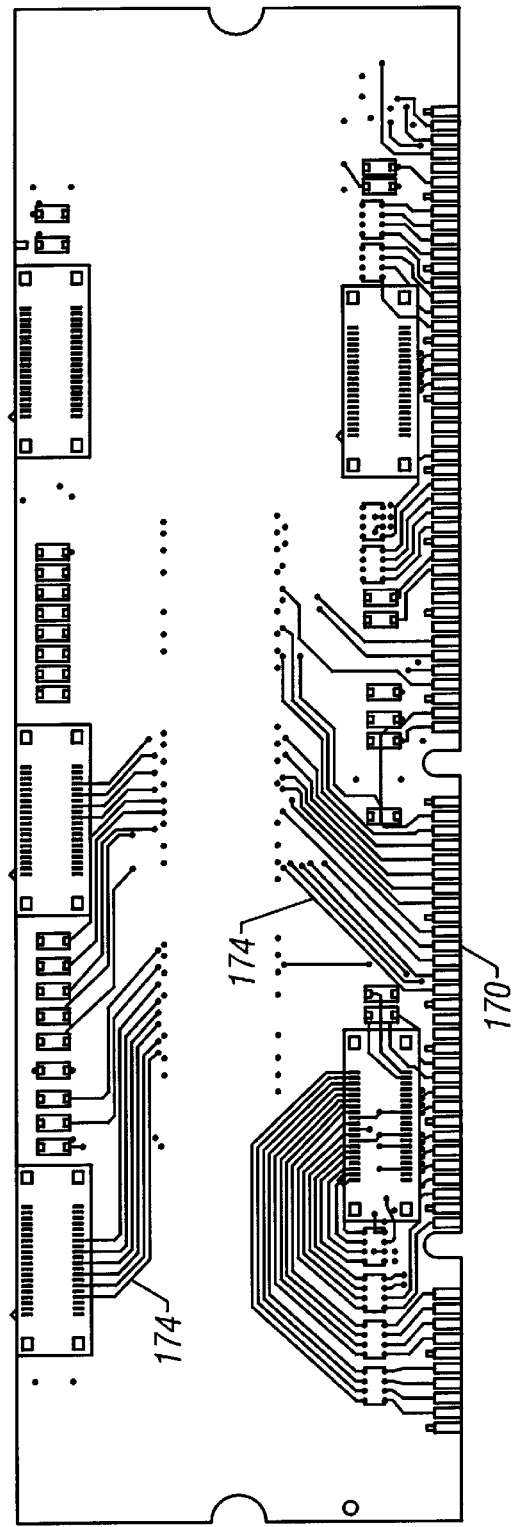
FIG. 11B is a view similar to that of FIG. 11A, illustrating a masked wiring arrangement on the second side of the primary board.

Each surface mount connector 166 includes a male surface mount connector and a matching female surface mount connector which may be easily connected and disconnected. Primary board 162 may include five male surface mount connectors 166a on each side thereof with three of the male surface mount connectors 166a arranged in a single row along the top portion of the primary board 162 and the remaining two male surface mount connectors 166b arranged in a single row along the bottom portion of the primary board 162 adjacent to the electrical interface portion 170. Chips 167 mounted on primary board 162 communicate with male surface mount connectors 166a by traces 174 as shown in FIGS. 11A and 11B. In addition, male surface mount connectors 166a are electrically connected to interface portion 170 of primary board 162.

With additional reference to FIGS. 12A and 12B, each auxiliary board 164 includes five female surface mount connectors 166b which mechanically and electrically connect with the corresponding male surface mount connectors 166a of primary board 162. Chips 168 mounted on each of the auxiliary boards 164 communicate with the female surface mount connectors 166b by traces 174 as shown in FIGS. 12A and 12B. Thus, auxiliary boards 164 and primary board 162 are electrically and mechanically connected by the male connectors 166a and female connectors 166b. It is noted that a primary board may comprise fewer or more than five male surface mount connectors on each side, and each auxiliary board may correspondingly comprise fewer or more than five female connectors. In addition, male surface connectors may be mounted on auxiliary boards and female surface mount connectors may be mounted on a primary board.

Figure 13A:
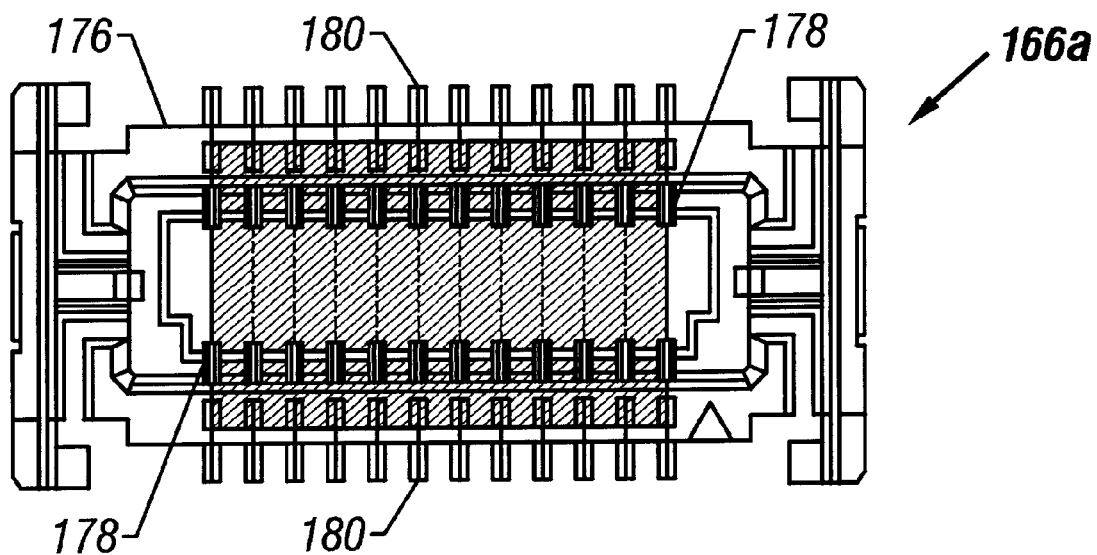
FIG. 13A is a top view of a male surface mount connector of the expansion module illustrated in FIG. 7.
Figure 13B:
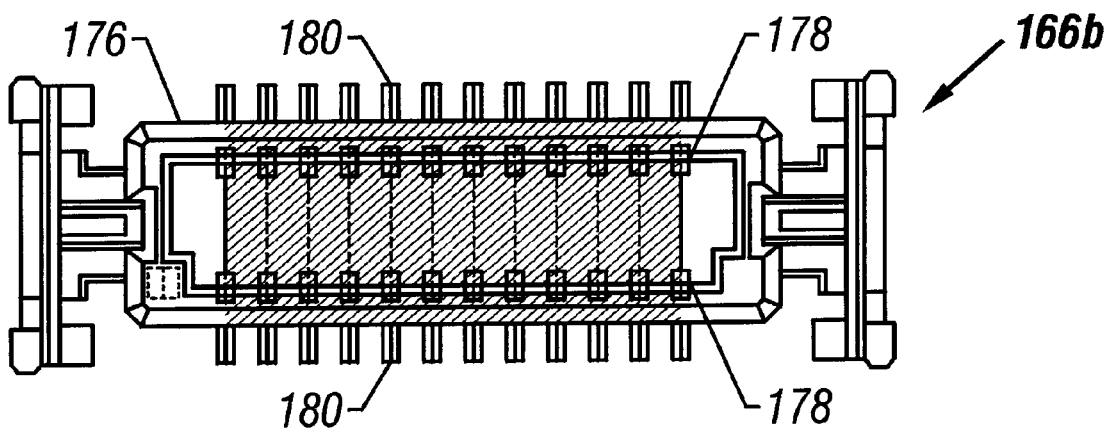
FIG. 13B is a top view of a female surface mount connector of the expansion module illustrated in FIG. 7.
Figure 15:
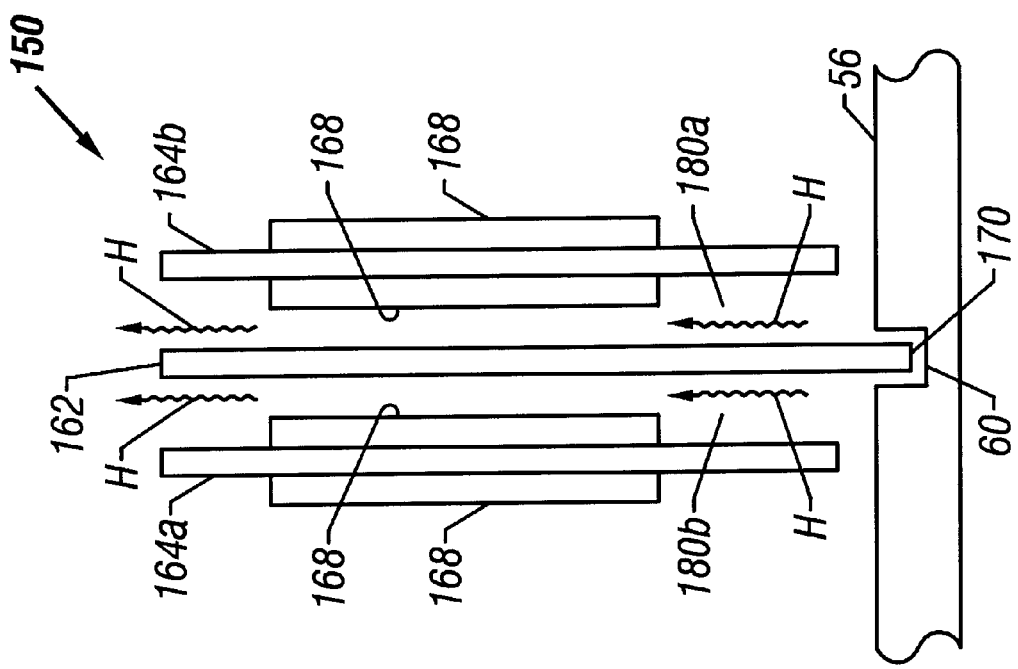
FIG. 15 is a cross-sectional view of an expansion module illustrated in FIG. 7, particularly illustrating open air paths defined between boards in a spaced relationship.

With additional reference to FIGS. 13A and 13B, both the male connectors 166a and female connectors 166b include a non-electrically conductive housing 176. The housing 176 encloses a plurality of electrical contacts 178 which electrically connect the male connectors 166a to the female connectors 166b. A plurality of fingers 180 extend laterally and outwardly from the housing 176. Presently, it is contemplated that the male connectors 166a and female connectors 166b each comprise forty electrically contacts 178 and forty fingers 180. However, the number of contacts 178 and fingers 180 can range from twenty to eighty, or any other appropriate number. The fingers 180 are attached to the boards 162 and 164 by methods generally known in the art such as by soldering the fingers 180 to pads on the boards 162 and 164. As discussed above in regards to the embodiment illustrated in FIG. 2, each board 162 and 164 may be a multiple-layer glass epoxy configuration with traces 174 applied by solder masks.

The auxiliary boards 164 can be readily disconnected from the primary board 162 by simply separating the male connectors 166a from their matching female connectors 166b. By separating the boards 162 and 164, the functionality of the boards 162 and 164 can be independently subjected to electrical failure verification and failure analysis. In addition, the electrical test equipment can be interfaced with each of the boards 162 and 164 via the surface mount connectors 166. For example, the electrical test equipment can include a coupling which mates with the surface mount connector, thus, replacing the costly and time consuming method of testing boards with custom bed-of-nail test fixtures.

With further reference to FIGS. 7 and 8, memory module 150 may further include fastening pins 182 which provide a secondary means of mechanically connecting the primary board 162 to the auxiliary boards 164. Fastening pins 182 are particularly useful when the module 150 is exposed to harsh environmental conditions such as high frequency vibrations, high shock impacts, and thermal cycling. Each of the fastening pins 182 may be fitted and soldered into openings 184 formed in each corner of the of the boards 162 and 164. It is noted that exemplary module 150 may comprise fewer or less than four fastening pins, and the pins may be secured to the boards 162 and 164 by other means such as an adhesive or other means generally known in the art.

With additional reference to FIG. 13, trace length L may be defined as the total length of electrical connection extending from the edge connectors of interface portion 170 of primary board 162 to one of the chips 168 on the auxiliary board 164. In accordance with this definition, auxiliary board 164a has a trace length $L_a$, and auxiliary board 164b has a trace length $L_b$, as shown by dashed arrows. Exemplary module 150 is configured such that trace lengths $L_a$ and $L_b$ of auxiliary boards 164a and 164b are substantially equal.

It is preferred for surface mount connectors 166 positioned near the bottom edges of board 162 and 164 (that is, near mother board 56) to serve as electrical connectors for carrying the most significant or time-dependent electrical signals from mother board 56 to auxiliary board 164 of module 150. Surface mount connectors 166 positioned near the top edges of boards 162 and 164 (that is, along edges opposite to that at which interface portion 170 is disposed as shown in FIG. 7) may serve as electrical connectors for carrying less time-dependent signals, such as power, ground, and address lines, for example.

Figure 14:
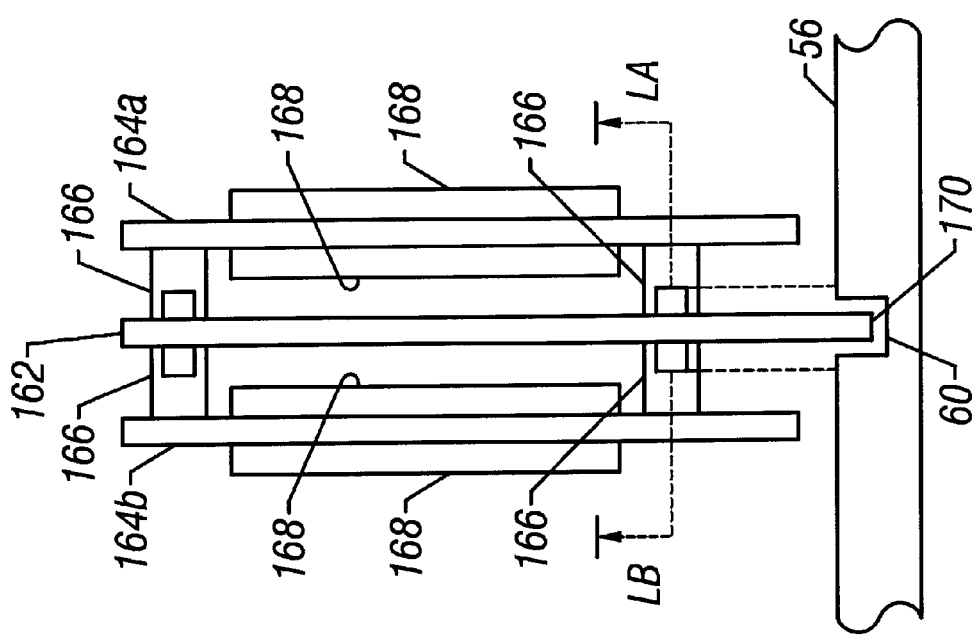
FIG. 14 is a cross-sectional view of the expansion module illustrated in FIG. 7, particularly illustrating minimized trace lengths of auxiliary boards of the module.

Referring now to FIG. 14, module 150 is illustrated mounted in an expansion slot 60 of a mother board 56. For the same reasons discussed above in regards to the embodiment illustrated in FIG. 2, the spaced parallel-plane arrangement of module 150 is configured to promote circulation and allow heat (which is shown by cursive arrows and reference H) to rise and escape. The spaced parallel-plane arrangement defines an air path 180a between auxiliary board 164a and primary board 162 and air path 180b between auxiliary board 164b and primary board 162. Air paths 180 are open along top and bottom edges of boards 162 and 164, and the surface mount connectors are relatively small and do not present substantial air blockage.

The memory module 50 and 150 shown in FIG. 1 may have a thickness as defined from the outer or external side (i.e., the side not facing primary board 62) of one of the auxiliary boards 64 to the outer side of the other auxiliary board 64 of less than about 0.5 inch but preferably less than about 0.325 inch. In addition, the memory module of the present invention may have an overall height as defined from the bottom edge to the top edge of primary board 62 of less than about one and a half inches but preferably less than about 1.40 inches.

Those skilled in the art will understand that the embodiments of the present invention described above exemplify the present invention and do not limit the scope of the invention to these specifically illustrated and described embodiments. The scope of the invention is determined by the terms of the appended claims and their legal equivalents, rather than by the described examples. In addition, the exemplary embodiments provide a foundation from which numerous alternatives and modifications may be made, which alternatives and modifications are also within the scope of the present invention as defined in the appended claims.

What is claimed is:

1. A module for mounting in an expansion slot of a mother board of a computer, said module comprising:
    a primary board including an interface portion for engaging with the expansion slot, said primary board having a first side and a second side;
    an auxiliary board mounted to said first side of said primary board in a spaced relationship such that an air path is defined between said boards;
    a second auxiliary board mounted to said second side of said primary board in a spaced relationship such that an air path is defined between said boards;
    a plurality of surface mount connectors for mounting said auxiliary board to said primary board;
    an additional plurality of surface mount connectors for mounting said second auxiliary board to said primary board;
    a trace on said auxiliary board for electrically connecting said auxiliary board to said primary board; and
    a second trace on said second auxiliary board for electrically connecting said second auxiliary board to said primary board;
    wherein said surface mount connectors and said additional surface mount connectors each include a male surface mount connector and a corresponding female surface mount connector; and
    wherein said male connector mates with said female connector.

2. The module of claim 1 wherein said trace is substantially equal in length to said second trace.

3. The module of claim 1 wherein said plurality of surface mount connectors and said additional plurality of surface mount connectors include electrically conductive contacts for functioning as electrical connectors between said auxiliary boards and said primary board.

4. The module of claim 1 wherein said surface mount connectors and said additional surface mount connectors are connected to said traces.

5. The module of claim 1 wherein said interface portion is configured to be compatible with an industry standard memory module expansion slot.

6. The module of claim 1 wherein said male connectors being directly attached to said first side and said second side of said primary board, and said female connectors being directly attached to a side of said auxiliary boards.

7. The module of claim 1 wherein each side of said primary board includes five said male connectors arranged in a first row and a second row, wherein said first row being adjacent to a top edge of said primary board and said second board being adjacent to a bottom edge of said primary board.

8. The module of claim 7 further comprising:
    a plurality of chips mounted to said auxiliary boards, said plurality of chips including memory chips;
    one end of said trace connecting to at least one of said plurality of chips and the other end of said trace connecting to at least one of said plurality of surface mount connectors;
    one end of said second trace connecting to at least one of said additional plurality of chips and the other end of said second trace connecting to at least one of said plurality of additional surface mount connectors and to at least one of said plurality of surface mount connectors and said second trace connecting to at least one of said plurality of chips; and
    a plurality of additional chips mounted to said primary boards.

9. The module of claim 1 further comprising a fastening pin securing said primary board and said auxiliary boards together, wherein said fastening pin fits into apertures formed in each of said primary board and said auxiliary boards.

10. A computer comprising:
    a mother board including an expansion slot; and
    a memory module including:
        a primary board including a plurality of integrated circuit chips, and an interface portion configured to be engaged with said expansion slot;
        a pair of auxiliary boards mounted to respective sides of said primary board in a spaced relationship such that an air path is defined between each of said auxiliary boards and said primary board;
        a plurality of additional integrated circuit chips connected to said auxiliary boards;
        a plurality of surface mount connectors for mounting said auxiliary boards to said primary board, each of said surface mount connectors including a male surface mount connector and a matching female surface mount connector, wherein said male connector mates with said female connector with a friction fit; and a trace for each said auxiliary board electrically connecting each said auxiliary board to said primary board.

11. The computer of claim 10 wherein said expansion slot is configured as a 168-pin dual in-line memory module (DIMM) connector.

12. The computer of claim 10 wherein each said trace of said auxiliary boards have substantially equal lengths.

13. The computer of claim 12 further including a fastening pin securing said primary board and said auxiliary boards together, wherein said fastening pin fits into apertures formed in each of said primary board and said auxiliary boards.

14. A method for increasing memory capacity of a computer, comprising:

(a) providing a computer including a mother board with an expansion slot;

(b) providing a memory module including:
a primary board including an interface portion configured to engage with the expansion slot of the computer, a plurality of chips including memory chips, and a trace connecting the interface portion with at least one of the chips;
an auxiliary board attached to the primary board in a spaced relationship such that an air path is defined between the boards, the auxiliary board including a plurality of chips including memory chips;
a plurality of surface mount connectors for mechanically and electrically connecting the auxiliary board to the primary board wherein each of the surface mount connectors includes a male surface mount connector and a corresponding female surface mount connector, the male connector and the female connector mate to form a friction fit, and the male connector being attached to the primary board and the female connector attached to the auxiliary board;
a trace on the auxiliary board connecting the surface mount connectors with at least one of the chips; and (c) inserting the interface portion of the memory module into the expansion slot of the computer.

15. The method of claim 14 wherein the expansion slot is a 168-pin dual in-line memory module (DIMM) expansion slot, and the primary board has at least 200 megabytes of memory capacity.

16. The method of claim 14 further comprising:

(d) arranging the surface mount connectors in a first row adjacent to a top edge of the primary board and auxiliary board; and (e) arranging the surface mount connectors in a second row adjacent to a bottom edge of the primary board and auxiliary board.

17. The method of claim 14 further comprising mechanically attaching the primary board and auxiliary board together by inserting a fastening pin through a hole in each of the primary board and auxiliary board.

18. A module for mounting in an expansion slot of a mother board of a computer, said module comprising:

a primary board comprising:
an interface portion for engaging with the expansion slot;
a plurality of chips mounted thereon; and
a trace connecting said interface portion to at least one of said plurality of chips;

an auxiliary board mounted to said primary board in a spaced relationship such that an air path is defined between said boards;

a plurality of fasteners for mounting said auxiliary board to said primary board; and a trace for electrically connecting said auxiliary board to said primary board;

wherein said trace of said primary board has a length substantially equal to said trace connecting said auxiliary board with said primary board.

19. A module as claimed in claim 18 wherein said primary board has a first side and a second side, said auxiliary board being mounted on said first side of said primary board;

said module further comprising:
a second auxiliary board mounted on said second side of said primary board in a spaced relationship such that an air path is defined between said boards; and
a second trace for electrically connecting said second auxiliary board to said primary board;
said plurality of fasteners including fasteners for mounting said second auxiliary board to said primary board.

20. A module as claimed in claim 19 wherein said plurality of fasteners include conductive fasteners for functioning as electrical connectors between said auxiliary boards and said primary board.

21. A module as claimed in claim 20 wherein said conductive fasteners are connected to said traces.

22. A module as claimed in claim 18 wherein said interface portion is configured to be compatible with an industry standard memory module expansion slot.

23. A module as claimed in claim 22 further comprising a plurality of chips mounted to said boards, said plurality of chips including memory chips.

24. A module as claimed in claim 18 wherein each of said boards has a top edge and a bottom;

said interface portion being disposed along the bottom edge of said primary board.

25. A module as claimed in claim 24 wherein said air path is substantially open along the top edges of said boards.

26. A computer comprising:
a mother board including an expansion slot;
a memory module including:
a primary board including:
an interface portion configured to be engaged with said expansion slot;
a plurality of chips mounted thereon; and
a trace connecting said interface portion with at least one of said plurality of chips;
a pair of auxiliary boards mounted to respective sides of said primary board in a spaced relationship such that an air path is defined between each of said auxiliary boards and said primary board;
a plurality of fasteners for mounting said auxiliary boards to said primary board; and
a pair of traces each for electrically connecting one of said auxiliary boards to said primary board;
wherein said trace of said primary board has a length substantially equal to the length of said pair of traces.

27. A computer as claimed in claim 26 wherein said expansion slot is configured as a 168-pin dual in-line memory module (DIMM) connector.

28. A computer as claimed in claims 26 wherein said memory module has a thickness defined from an outer edge of one said auxiliary board to an outer edge of the other said auxiliary board of less than about 0.5 inch and a height defined from the bottom edge to the top edge of said primary board of less than about 1.5 inches.

29. A module for mounting in an expansion slot of a mother board of a computer, said module comprising:
  a primary board having an interface portion engaging with the expansion slot;
  an auxiliary board mounted to said primary board in a spaced relationship such that an air path is defined between said boards; and
  a plurality of surface mount connectors for mounting said auxiliary board to said primary board;
  each of said surface mount connectors having a male surface mount connector and a matching female surface mount connector;
  wherein said male surface mount connector mates with said matching female surface mount connector.

30. The module of claim 29 wherein said primary board has a first side and a second side, said auxiliary board being mounted on said first side of said primary board, said module further comprising:
  a second auxiliary board mounted on said second side of said primary board in a spaced relationship such that an air path is defined between said boards; and
  an additional plurality of surface mount connectors for mounting said second auxiliary board to said primary board.

31. The module of claim 30 wherein said male connectors being directly attached to said first side and said second side of said primary board, and said female connectors being directly attached to a side of said auxiliary boards.

32. The module of claim 31 further comprising
  a plurality of chips mounted to said auxiliary boards, said plurality of chips including memory chips; and
  A plurality of additional chips mounted to said primary board.

33. The module of claim 29 wherein said interface portion is configured to be compatible with an industry standard memory module expansion slot.

34. The module of claim 29 further comprising a fastening pin securing said primary board and said auxiliary board together, wherein said fastening pin fits into apertures formed in each of said primary board and said auxiliary board.

35. A method of forming a memory module comprising:
  (a) providing a primary board;
  (b) attaching a plurality of chips on the primary board;
  (c) providing an auxiliary board;
  (d) attaching a plurality of chips on the auxiliary board;
  (e) mechanically and electrically connecting the auxiliary board to the primary board in a spaced relationship such that an air path is defined between the auxiliary board and the primary board;
  (f) mounting a plurality of surface mount connectors to the auxiliary board and the primary board to perform step (e), each of the surface mount connectors having a male surface mount connector and a matching female surface mount connector, and the male surface mount connector mating with the matching female surface mount connector to form a friction fit.

36. The method of claim 35 further comprising:
  (g) arranging the surface mount connectors in a first row adjacent a top edge of the primary board and the auxiliary board; and
  (h) arranging the surface mount connectors in a second row adjacent to a bottom edge of the primary board and the auxiliary board.

37. The method of claim 35 further comprising:
  (g) mechanically attaching the primary board to the auxiliary board by inserting a fastening pin through a hole in each of the primary board and the auxiliary board.

38. A module for mounting in an expansion slot of a mother board of a computer, said module comprising:
  a primary board comprising:
    an interface portion engageable with the expansion slot;
    a first plurality of chips disposed on said primary board; and
    a first trace connecting said interface portion to at least one of said first plurality of chips;
  an auxiliary board mounted to said primary board in a spaced relationship such that an air path is defined between said boards, said auxiliary board comprising:
    a second plurality of chips disposed on said auxiliary board; and
    a second trace connecting at least one of said second plurality of chips to said primary board;
  wherein said first trace has a length substantially equal to said second trace; and
    a plurality of fasteners for mounting said auxiliary board to said primary board.

39. The module of claim 38 wherein said plurality of fasteners are surface mount connectors, each of said surface mount connectors having a male surface mount connector and a matching female surface mount connector, said male surface mount connector mating with said matching female surface mount connector to form a friction fit, said male surface mount connector attachable to one of said primary board and said auxiliary board, and said matching female surface mount connector attachable to the other one of said primary board and said auxiliary board.

40. The module of claim 39 wherein said primary board has a first side and a second side, said auxiliary board mountable to said first side of said primary board, and said module further comprising:
  a second auxiliary board mountable to said second side of said primary board in a spaced relationship such that an air path is defined between said secondary auxiliary board and said primary board;
  a third trace for electrically connecting said second auxiliary board to said primary board;
  wherein said first trace has a length substantially equal to said third trace; and
  another plurality of fasteners for mounting said second auxiliary board to said primary board.

41. The module of claim 38 wherein said plurality of fasteners are connected to said first trace and said second trace.

42. The module of claim 38 wherein said interface portion is configured to be compatible with an industry standard memory module expansion slot.

43. The module of claim 38 where said plurality of chips are memory chips.

\* \* \* \* \*